United States Patent
Keskinarkaus

(10) Patent No.: US 11,949,361 B2
(45) Date of Patent: Apr. 2, 2024

(54) VARIABLE SPEED DRIVE FOR DRIVING AN ELECTRIC MOTOR AND METHOD FOR DIAGNOSING THE DRIVE

(71) Applicant: Vacon Oy, Vaasa (FI)

(72) Inventor: Antti Samuli Keskinarkaus, Tampere (FI)

(73) Assignee: Vacon OY, Vaasa (FI)

( * ) Notice: Subject to any disclaimer, the term of this patent is extended or adjusted under 35 U.S.C. 154(b) by 134 days.

(21) Appl. No.: 17/398,171

(22) Filed: Aug. 10, 2021

(65) Prior Publication Data

US 2022/0052635 A1 Feb. 17, 2022

(30) Foreign Application Priority Data

Aug. 12, 2020 (DE) ............ 102020121253.4

(51) Int. Cl.
*H02P 29/032* (2016.01)
*G01R 31/34* (2020.01)

(52) U.S. Cl.
CPC .......... *H02P 29/032* (2016.02); *G01R 31/343* (2013.01)

(58) Field of Classification Search
CPC .. B66B 1/30; B66B 1/308; B66B 1/32; B66B 13/22; B66B 5/00; B66B 5/0031; B66B 5/02; B66B 5/06; B66B 5/025; B66B 2201/00; G01R 31/343; H02P 29/032

USPC .......................................... 318/468
See application file for complete search history.

(56) References Cited

U.S. PATENT DOCUMENTS

| | | | |
|---|---|---|---|
| 7,511,442 B2 * | 3/2009 | Jehle | G01R 31/34 318/467 |
| 9,941,823 B2 * | 4/2018 | Hisamatsu | H02P 6/28 |
| 2022/0021562 A1 * | 1/2022 | Khan | H04L 25/4902 |

FOREIGN PATENT DOCUMENTS

| EP | 3457555 A1 | 3/2019 |
|---|---|---|
| EP | 3588208 A1 | 1/2020 |

\* cited by examiner

*Primary Examiner* — Said Bouziane
(74) *Attorney, Agent, or Firm* — McCormick, Paulding & Huber PLLC

(57) ABSTRACT

The present invention relates to a variable speed drive for driving an electric motor and providing a safe torque off (STO) function. The drive includes two parallel signal buffers connected to a safety controller and at least one IGBT gate driver circuit, wherein the signal buffers share the same IGBT gate control signals as inputs and feed them to the same IGBT gate driver circuits and wherein each signal buffer has an own STO control signal for activation and deactivation of outputs. The invention is also directed at a method for diagnosing a corresponding drive.

20 Claims, 3 Drawing Sheets

VARIABLE SPEED DRIVE FOR DRIVING AN ELECTRIC MOTOR AND METHOD FOR DIAGNOSING THE DRIVE

CROSS-REFERENCE TO RELATED APPLICATION

This application claims foreign priority benefits under 35 U.S.C. § 119 to German Patent Application No. 102020121253.4 filed on Aug. 12, 2020, the content of which is hereby incorporated by reference in its entirety.

TECHNICAL FIELD

The present invention relates to a variable speed drive for driving an electric motor and providing a safe torque off (STO) function. The drive comprises two parallel signal buffers connected to a safety controller and at least one IGBT gate driver circuit, wherein the signal buffers share the same IGBT gate control signals as inputs and feed them to the same IGBT gate driver circuits and wherein each signal buffer has an own STO control signal for activation and deactivation of its outputs. The invention is also directed at a method for diagnosing a corresponding drive.

BACKGROUND

Variable speed drives are used for driving electric motors at desired output characteristics. The invention may preferably be used in variable speed drives in industry, motion and elevator applications, where rated functional safety circuits may be required. Because of the required safety levels, the drives may include safety functions such as safe torque off (STO).

In rated functional safety circuits such as SIL3 (Safety Integrity Level 3) it may be required that their functions and/or hardware components are diagnosed and/or monitored for hardware failures. In many occasions, the diagnostics is based on test pulses that are injected to a safety signal and feedback generated in response to the safety signal is read later from the signal chain.

In variable speed drives, the STO function is used for preventing the electric motor from generating torque on its axle in situations where it could cause personal injury or material damage, such as when an elevator car is on the level with its doors open or an operator is inserting a new piece of material in a cutting machine. There are some alternative means to achieve this functionality, but often it is implemented by adding a switching element in output IGBT bridge gate control signals that prevents the PWM modulation generated by the non-safety controller of the drive from reaching the IGBT gates. This prevents the output bridge (inverter) from switching and thus the motor from generating torque. Cutting the path of those low-voltage gate control signals is often less costly than adding an external safety contactor on the inverter output phases.

Adding a switching element to the gate control signal lines sets limits to the form of test pulsing, as the drive's normal operation should not be interrupted while the function's capability to stop the drive's modulation should still be diagnosed as far as possible. Affecting the gate control signals can be risky as misbehavior in signal handling can cause severe damage to the drive.

In devices known from the art these issues are managed by reading the diagnostics test pulse feedback before the last switching element of the safety chain. Between the feedback-reading point and final switching element, a filter prevents the test pulses from affecting the switch. The final switching element would then only be controlled if the STO request were truly active, i.e. the activation time is long enough. Even more problematically, often no feedback is gained from the signal chain after the final element of the safety chain as the modulation is already stopped by normal means before the final safety chain element is switched open. The feedback cannot be read after the final element of the safety chain and it is therefore not known if the signal cutoff by safety means was successful or not. This leaves a blind spot on the diagnostics, as a short circuit over the final switching element would not be detected. In the worst case, both independent STO channels could eventually fail without noticing, which could result in the motor shaft suddenly starting rotation or to continuing rotation even when a safety function is called by, for example, actuating an emergency switch.

Besides being a theoretical safety risk, the limited diagnostics also significantly weakens the functional safety key values calculated from the fault modes and their detectability in the safety designs. An undiagnosed component with a fault mode (such as short-circuit) that leads to dangerous situation (such as the safety function not being able to prevent the gate control signals from reaching the IGBTs/inverter bridge) will weaken the safety key values substantially. In practice, this is relevant when the design is being approved by a notified body such as TÜV or IFA, but it also affects the safety failure budget that a user of the drive has, if the drive is used as a component of a more complex system.

SUMMARY

The aim of the present invention is to provide an improved drive and a method for diagnosing the drive, which overcome the above-mentioned problems. This aim is achieved by a drive according to claim 1 and a method for diagnosing the drive according to claim 9. Advantageous embodiments of the invention are subject of the dependent claims.

According to the invention, a variable speed drive for driving an electric motor with a safe torque off (STO) function is provided. The drive comprises two parallel signal buffers connected to a safety controller and at least one IGBT gate driver circuit, or insulated-gate bipolar transistor gate drivers. The signal buffers share the same IGBT gate control signals as inputs and feed them to the same IGBT gate driver circuits. Each signal buffer is connected such that it may receive an own STO control signal for activation and deactivation of its outputs. The STO control signals received by the signal buffers may be provided by the safety controller.

The safe torque off (STO) function is a safety function integrated within the drive. Alternatively or additionally, the function may be implemented externally with respect to the drive, for example in the form of a safety contactor. The STO may be used to prevent undesired motor rotation in the event of e.g. an emergency while the drive remains connected to a power supply. When STO is activated, the motor cannot generate torque. The term STO function presently used may be understood in a broad sense and may comprise any hardware and/or software features required for effectively putting the STO function into practice.

The basic idea of the invention is to use two parallel signal buffers or switch banks to deliver the gate control signals to the IGBT gate driver circuits. Both buffers share the same IGBT gate control signals as inputs and feed them to the same IGBT gate driver circuits. Crucially, the buffers can be diagnosed separately. When a first buffer circuit is being diagnosed as to its capability to perform the STO function when requested, the other buffer circuit continues feeding signals e.g. from a modulator, i.e. a control board or a field programmable gate array (FPGA) to the IGBT gate driver circuits. After diagnostics shows the first buffer to be operating correctly, the first buffer may be set to carry the gate control signals while the second buffer may be diagnosed. The diagnostics may be carried out by the safety controller and/or some other equipment capable of diagnosing the buffers. One main advantage of the present invention's design is that the diagnostics coverage can be extended to the final switching element of the drive's safety chain without affecting the drive's normal operation. The invention makes it possible to diagnose the safety circuit more comprehensively than the circuits known from the art, without interrupting the normal operation of the drive.

According to the invention, one parallel buffer structure may be provided for high-side gates of the drive. If the STO function is supposed to also cut at low-side gate control signals e.g. as a function of another redundant safety channel, another parallel buffer structure may be provided for channel independency. Alternatively, all the gate control signals for the high- and low-side IGBTs can be routed through one parallel buffer structure.

The invention can be carried out with any number of gate driver circuits in the drive, such as a single-IGBT system, for example, a mechanical brake controller, a system comprising two IGBTs or as a parallel IGBT structure with more than ten IGBTs.

The IGBT gate control signals may come from a non-safety modulator, such as an MCU or FPGA, and each of these signals may be connected to both buffers, or more precisely, to the buffers' input sides. Depending on the state of STO control signals for each buffer, the IGBT gate control signals are passed on to the buffer's output or blocked in the buffer. The two corresponding outputs from the buffers, i.e. one output from each buffer, are related to a certain gate control signal and are combined with OR-logic operators back into a single signal. That signal is then routed to the corresponding IGBT gate driver circuit. The signal buffers share the same IGBT gate control signals, as the IGBT gate control signals are connected to both buffers.

The buffers share the same IGBT gate control signals as inputs and each signal buffer has an own STO control signal for activation and deactivation of its outputs. Depending on the state of the STO control signals, the buffers may pass the IGBT gate control signals onwards or block them. The two output signals from the two buffers, related to the same IGBT gate control signal input, are combined into a single signal, which is then connected to the IGBT gate driver circuit. The similar functionality applies to all the IGBT gate control signals involved. Therefore, according to the invention, the signal buffers are connected to the same IGBT gate driver circuits, such that signals from the buffers can reach the IGBT gate driver circuits after the signals have passed e.g. some series diodes.

In a preferred embodiment of the invention, the safety controller comprises a complex programmable logic device (CPLD) and/or a field programmable gate array (FPGA) and/or a microcontroller unit (MCU). The safety controller may comprise some or all hardware and/or software required for diagnosing the drive. The safety controller may be designed to perform further functions of the drive such as outputting drive performance characteristics or other information pertaining to the drive to external devices and/or receiving external signals for e.g. changing the functions performed by the safety controller and/or the drive.

In another preferred embodiment of the invention, outputs for a certain gate of the two buffers are connected to the same point through series diodes. The connection between the outputs of the two buffers and said same point may be designed such that a common output measured at a gate driver circuit input is high if either or both of the buffers is providing high output.

In another preferred embodiment of the invention, all gate control signals to be cut off by the STO function are connected through series diodes. This may mean that all connections carrying signals, which should be cut off by the STO function in e.g. a case of emergency, comprise at least one diode.

In another preferred embodiment of the invention, each buffer has four input channels, one for each gate control signal and a fourth for being constantly supplied with a logical high input.

In a particularly preferred embodiment of the invention, the fourth input channel sets a feedback normally high during zero-vector conditions where all gate control signals can be low simultaneously. Without the fourth channel's constantly high input, the feedback would fall to low state during zero-vector, which would cause a diagnostics problem. The fourth channel does not affect the gate control signals.

In another preferred embodiment of the invention, either of the two buffers can be used to deliver signals to the IGBT gate driver circuit. This means that the buffers are connected to the IGBT gate driver circuit in a way, which makes it possible to deliver signals to the IGBT gate driver circuit by the first of the two buffers, without the second buffer affecting the signal in any significant way and vice versa. Therefore, it is possible to test the switching capability of the second buffer while the first buffer is providing signals to the IGBT gate driver circuit and vice versa.

In another preferred embodiment of the invention, diagnostics of the drive is performed by activating one of the two individual low-active outputs.

The low-active output may correspond to a low-active STO control signal and may set the corresponding buffer to a high-impedance state or may assign logical low to its output, depending on the buffer type used. If all the four switches in one buffer or switch bank are operating correctly and the outputs are set low or high-impedance state, the common feedback falls to zero. If any of the gate control signal outputs is stuck at high or does not follow the STO control signal, the feedback stays high or starts to repeat the PWM modulation present in the incoming IGBT gate control signal from the modulator, which indicates a safety hardware (HW) fault. More precisely, if one of the switches for gate control signals does not follow the STO activation command, the feedback is high only when the IGBT gate control signal to the corresponding switch from the modulator is high. As the IGBT gate control signals constantly alter between logical "1" and "0", the feedback may also alter similarly. The feedback will be at least part of the time "1", which will then be diagnosed as a HW fault.

If all the outputs of one buffer are stuck at low, the safety controller indicates that the system is at a safe state. If one or more buffer outputs for the IGBT gate control signals are stuck at low, this may not be detected and does not need to be detected by the safety controller as it can be regarded as a safe type of failure. However, this may cause a fault to be triggered by a non-safety modulator due to missing phase feedback signal. The diagnostics can also be operated in safe state by monitoring the feedback signals. In safe state, the STO control signals are low and the expected feedback states are also low. If both feedback signals are for some reason showing high state, a fault can be assumed in the STO circuit and the redundant (second) safety channel for STO can be activated to set the system to a safe state.

The present invention is also directed at a method according to claim 9. The method diagnoses a variable speed drive according to any of claims 1 to 8 and comprises the steps of
diagnosing the first buffer first,
reading back its feedback to the safety controller,
controlling the first buffer to conductive state,
diagnosing the second buffer,
reading back its feedback to the safety controller, and
controlling the second buffer to conductive state.

Controlling the first buffer to conductive state may comprise setting the first buffer such that it can be used for providing control signals to the IGBT gate driver circuits or a corresponding inverter bridge.

In a preferred embodiment of the method, a diagnosing test pulse length is only limited by a diagnostics sequence period, wherein a test pulse length of 500 ms±200 ms, in particular ±100 ms, is used for diagnosing each buffer.

BRIEF DESCRIPTION OF THE DRAWINGS

The method may comprise additional steps corresponding to the features presently described with respect to the variable speed drive. Further details and advantages of the invention are described with reference to the following figures.

DETAILED DESCRIPTION

Figure 1:
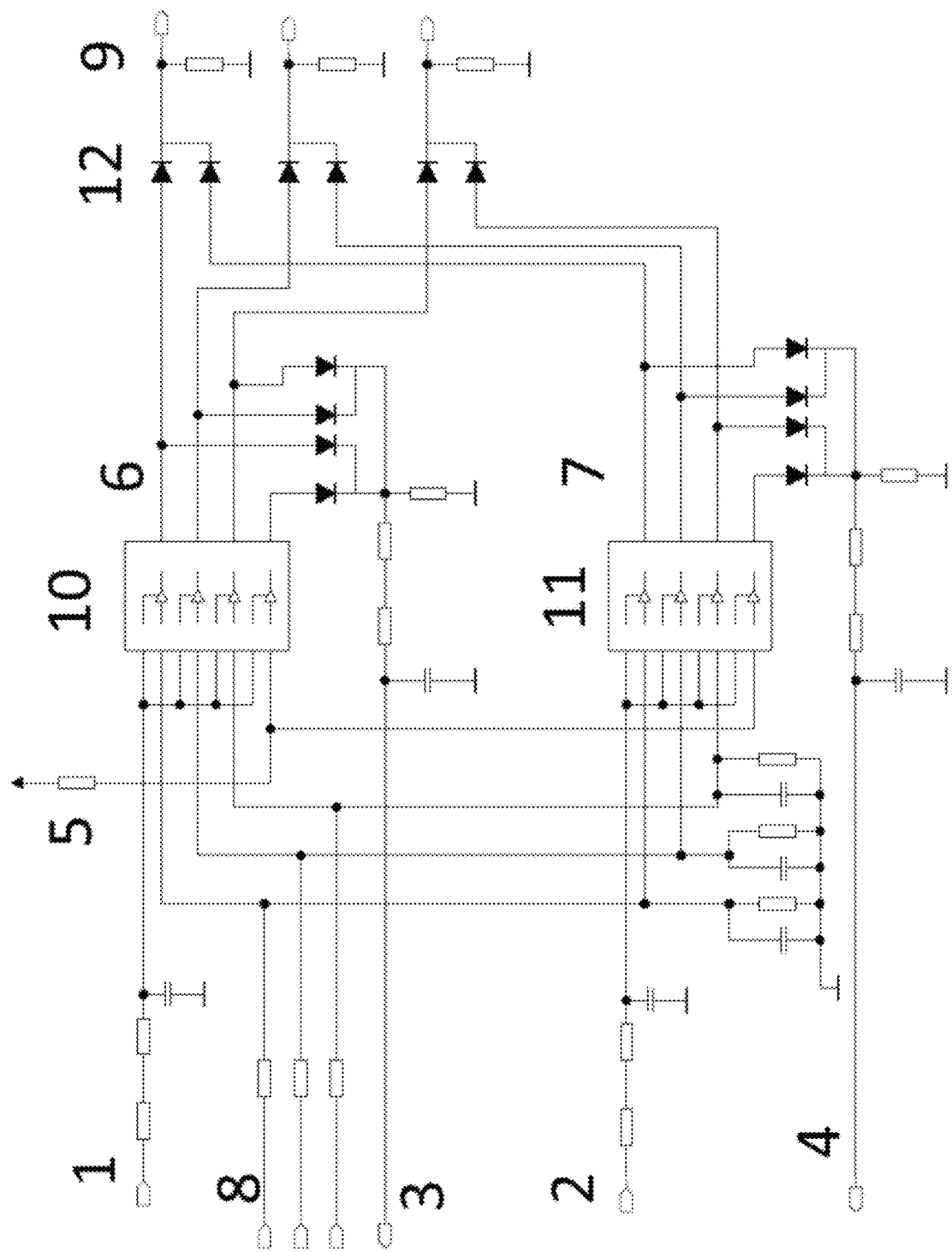
FIG. 1: schematic view of components of the drive according to the invention.

FIG. 1 shows a schematic view of components of the variable speed drive according to the invention. The drive serves for driving an electric motor not shown in FIG. 1 and provides a safe torque off (STO) function. The STO function ensures that no torque is generated by the motor in e.g. emergency situations. The STO function may comprise further components or feature that are not visible in FIG. 1.

The drive comprises two parallel signal buffers 10, 11 that are connected to a safety controller and at least one IGBT gate driver circuit. The signal buffers 10, 11 share the same IGBT gate control signals as inputs 8 and feed them to the same IGBT gate driver circuits. Each signal buffer 10, 11 is connected to receive an own STO control signal for activation and deactivation of outputs 1, 2.

The safety controller is not shown in FIG. 1 and may comprise a complex programmable logic device (CPLD) and/or a field programmable gate array (FPGA) and/or a microcontroller unit (MCU).

The outputs for a certain gate of the two buffers 10, 11 are connected to the same point 9 through series diodes 12. In the example of FIG. 1, three outputs of each buffer 10, 11 are connected to three common points 9 via six series diodes 12, that is, all gate control signals to be cut off by the STO function are connected through said series diodes 12.

Each buffer 10, 11 has four channels, one for each gate control signal 8 and a fourth 5 for being constantly supplied with a logical high input. The fourth input channel 5 sets a feedback 3, 4 normally high during zero-vector conditions where all gate control signals can be low simultaneously. Either of the two buffers 10, 11 can be used to deliver signals to the IGBT gate driver circuit independently from the other buffer 10, 11.

Diagnostics of the drive is performed by activating one of the two individual low-active STO control signals 1, 2. Diagnosing the variable speed drive, or more precisely diagnosing the STO function output or the parallel PWM signal buffer circuit of the variable speed drive, may comprise the steps of
diagnosing the first buffer 10 first,
reading back its feedback 3 to the safety controller,
controlling the first buffer 10 to conductive state,
diagnosing the second buffer 11,
reading back its feedback 4 to the safety controller, and
controlling the second buffer 11 to conductive state.

It may be irrelevant which of the two buffers 10, 11 is diagnosed first. When diagnosing the buffers 10, 11, a diagnosing test pulse length may only be limited by a diagnostics sequence period, wherein a test pulse length of 500 ms±200 ms, in particular ±100 ms, is used for diagnosing each buffer 10, 11.

The structure of the present invention's drive is basically built on two signal buffer circuits/switch banks 10, 11 with a high-active "enable" input, connected to a safety controller such as a CPLD (Complex Programmable Logic Device). The "switch banks 10, 11" may also be referred to as "buffers 10, 11", although their operation is closely similar to AND-gates.

Both buffers 10, 11 are sharing the same IGBT gate control signal inputs 8, but each buffer 10, 11 has an own STO control signal for activation/deactivation of the outputs 1, 2. The outputs for a certain gate of the two buffers 10, 11, related to the same shared IGBT gate control signal (one signal of the three IGBT gate control signals 8), are connected to the same point (9, to IGBT gate driver circuit) through series diodes 12 so that the common output measured at the gate driver circuit input 9 is high if either or both of the buffers 10, 11 is providing high output (at points 6, 7) on the related gate. The same structure applies to all the gate control signals to be cut off by STO.

Each buffer 10, 11 has four inputs, one for each gate control signal 8 and the fourth channel 5 for being constantly supplied with a logical high input. The fourth channel 5 is required to set the feedback 3, 4 normally high also during zero-vector conditions where all gate control signals can be low simultaneously. Without the fourth, constantly high input, the feedback would fall to low state during zero-vector, which would cause a diagnostics problem. The fourth channel 5 does not affect the gate control signals.

Therefore, either of the two buffers 10, 11 can be used to deliver the signals onwards to the IGBT gate driver circuit, thus making it possible to test the switching capability of the other buffer 10, 11 in the meantime. Diagnostics is performed by activating one of the two individual low-active STO control signals 1, 2 that sets the corresponding buffer 10, 11 to a high-impedance state or writes logical low to its output 6, 7, depending on the buffer type used. If all the four switches of one buffer 10, 11 are operating correctly and the outputs are written low or high-impedance, the common feedback 3, 4 falls to zero. If one or more of the gate control signal outputs is stuck at high or doesn't follow the STO control signal, the feedback stays high or starts to repeat the PWM modulation present in the incoming IGBT gate control signal from the modulator, which triggers a safety hardware fault.

If all the outputs of one buffer 10, 11 are stuck at low, the safety controller indicates that the system is at a safe state. If one or more buffer outputs for the IGBT gate control signals are stuck at low, this may not be detected and does not need to be detected by the safety controller as it can be regarded as a safe type of failure. The diagnostics can also be operated in safe state by monitoring the feedback signals. In safe state, the STO control signals are low and the expected feedback states are also low. If either or both feedback signals are for some reason showing high state, a fault can be assumed in the STO circuit and the redundant second safety channel for STO can be activated to set the system to a safe state.

After the first buffer 10 has been diagnosed and its feedback has been successfully read back to the safety controller, the first buffer 10 can be controlled to conductive state by setting STO control signal 1, 2 to logical high, and the other, second buffer 11 can then be diagnosed in turn. The order of the diagnosis of the buffers 10, 11 and the reference to the buffers as first and second buffers 10, 11 may be chosen arbitrarily and do not limit the scope of the invention. As the diagnostics test pulse length is only limited by the diagnostics sequence period (commonly around 1 s) that should be a time window to test both of the buffers 10, 11, a test pulse length of close to 500 ms can be used for each buffer 10, 11. This ensures that the several modulation patterns will be fed through the tested buffer 10, 11 when motor shaft is rotating.

Using two parallel buffers 10, 11 adds some more complexity to the diagnostics routine, but does not represent a major obstacle. Using two parallel buffers 10, 11 theoretically doubles the "dangerous detected" failure rate of the switching element block by doubling each signal switch on the gate control signal lines, but still offers better key values as the dangerous hardware faults are detected quickly. Detection is basically done well before the safety function is called for the next time. In safety systems with at least SIL3 rating, there is always at least a second independent way to perform the function in case the primary method fails or is diagnosed as inoperative.

Diagnostics can be designed to cover the complete STO safety function chain, thus offering better safety key values and leaving no dangerous undetected faults to the signal chain. This eases the certification process of the drive.

Since no time-critical diagnostics needs to be performed, component tolerances have less effect on the design. Diagnostics can be ran with e.g. a 1s period with 400 ms test pulse length, which gives more freedom for test sequence definition and makes the system less vulnerable to interference. No long HW filters are required according to the invention. In contrast, in prior implementations there have been issues with component tolerances that have caused the test pulses to affect the non-safety system behavior by causing random faults to the non-safety controller and stopping the drive.

When a safety controller (e.g. CPLD/FPGA/MCU) is used as a master operating and diagnostics device in the safety system, this implementation adds only minor additional costs to the board component costs compared to the prior implementations. A parallel PWM buffer also offers the possibility to monitor the switch condition in safe state, which may be required in some applications. Some safety function implementations (other than this invention) tend to be diagnosable only when they are in a non-safe state. This may cause problems in some applications, as the system must first enter a non-safe state to observe that the safety system is not working properly. In extreme cases, such actions could cause losing the system's capability to ensure user safety.

Figure 2:
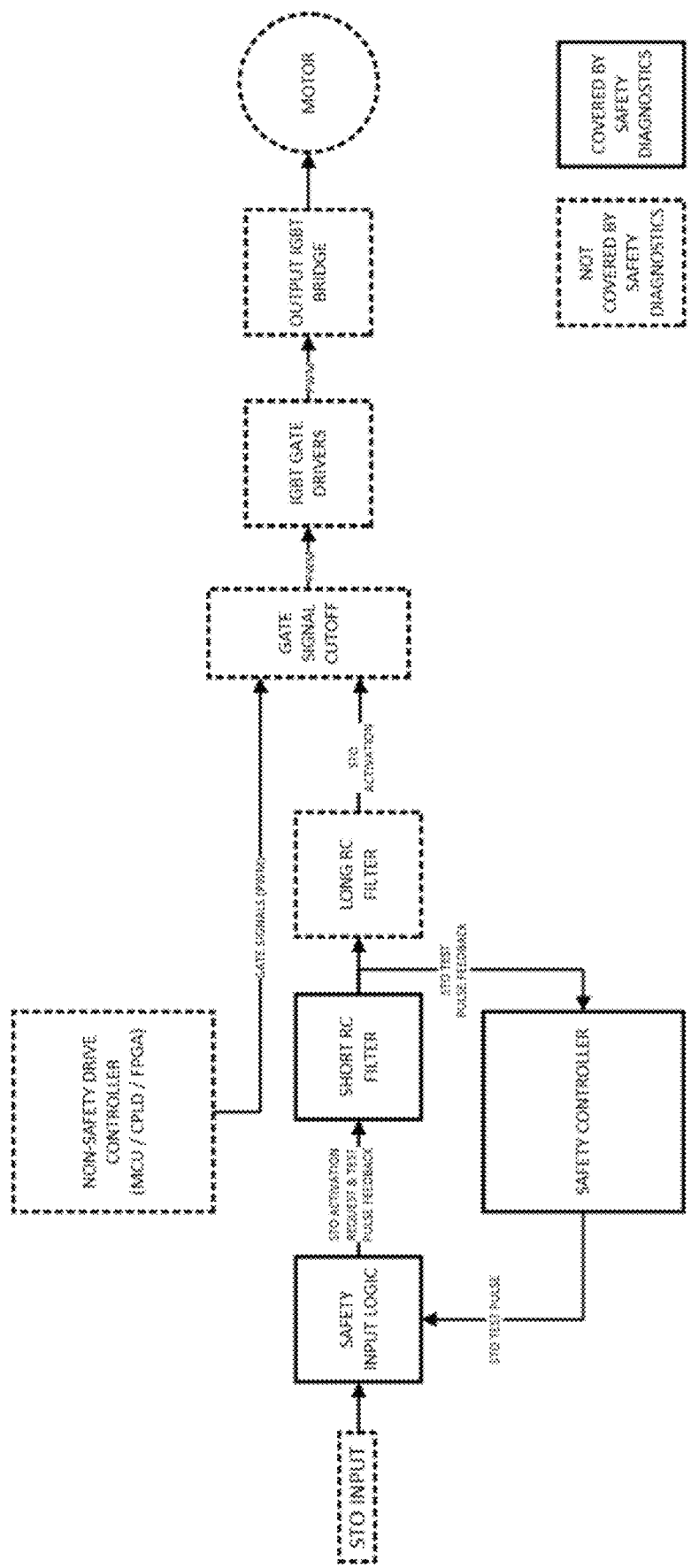
FIG. 2: schematic view of a STO function in a drive according to the state of the art.

FIG. 2 is a schematic view of a STO function in a drive according to the state of the art. Here, the actual signal cut-off element i.e. the element named "gate signal cutoff" is not covered by the diagnostics in the shown STO safety function chain. As a result, undetected dangerous failure modes may occur.

As can be seen, in devices known from the art, the diagnostics test pulse feedback is read before the last switching element of the safety chain. Between the feedback-reading point and final switching element, a filter that prevents the test pulses from affecting the switch is provided. The final switching element would then only be controlled if the STO request were truly active, i.e. the activation time is long enough. Even more problematically, no feedback is gained from the signal chain after the final element of the of the safety chain. It is therefore not known if the signal cutoff was successful or not. This leaves a blind spot on the diagnostics, as a short circuit over the final switching element would not be detected. In the worst case, both independent STO channels could eventually fail without noticing, which could lead to undesired motor movement even when a safety function is called by actuating an emergency switch.

This weakens the characteristic safety key values for the drive and for the customer's system. Undetected dangerous failure modes left in product also always tend to cause problems with certification authorities/notified bodies, thus increasing risks for product development phase schedules.

Figure 3:
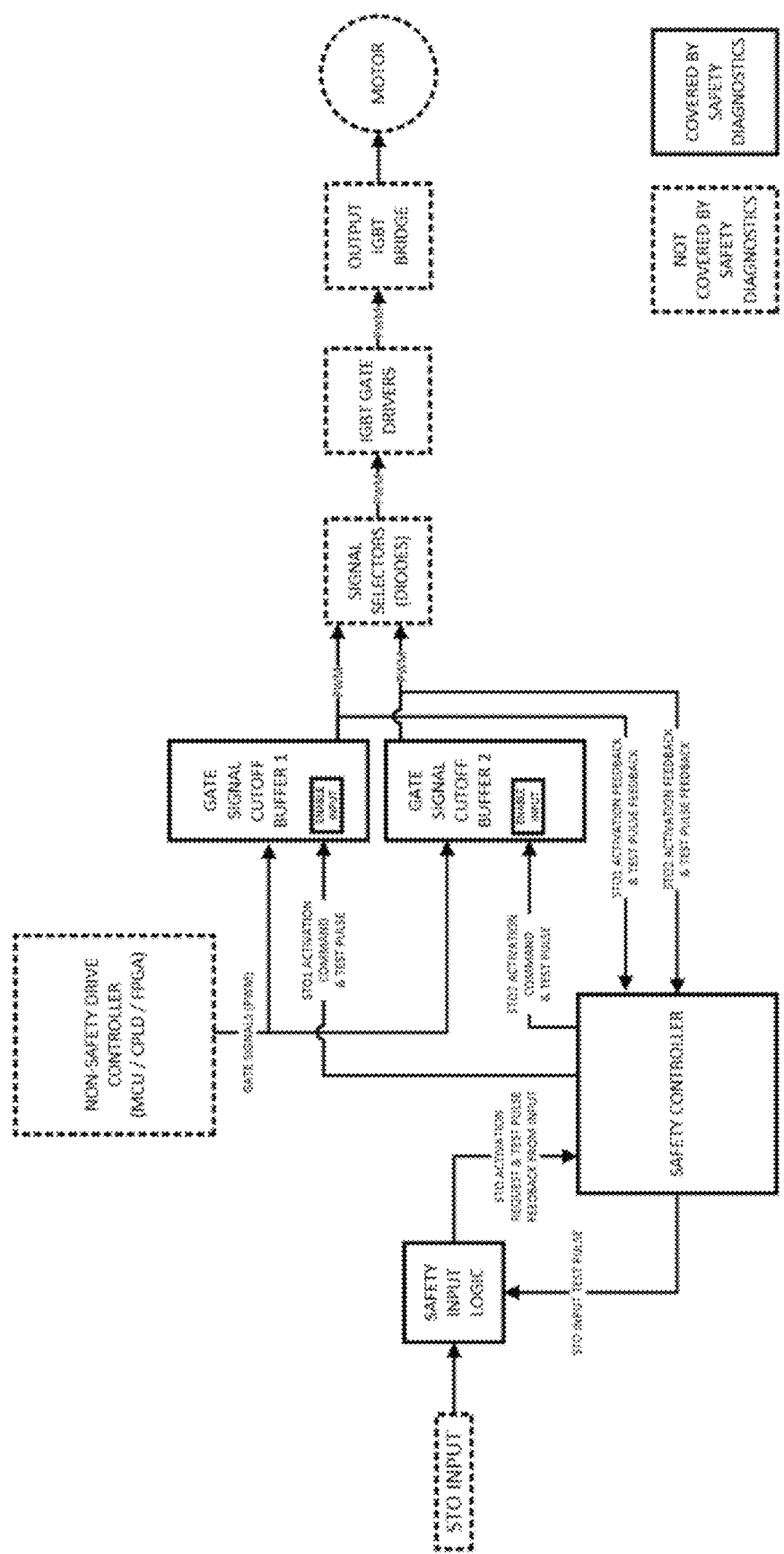
FIG. 3: schematic view of a STO function in a drive according to the invention.

FIG. 3 is a schematic view of a STO function in a drive according to the present invention. In contrast to the situation shown in FIG. 2, here, the actual signal cut-off elements i.e. the elements named "gate signal cutoff buffer 1" and "gate signal cutoff buffer 2" are covered by the diagnostics in the shown STO safety function chain. As a result, undetected dangerous failure modes are less likely to occur then according to the prior art.

The invention is not limited to one of the above-described embodiments but can be modified in many ways.

All the features and advantages arising from the claims, the description and the drawings, including constructive details, spatial arrangements and procedural steps, can be essential to the invention both individually and in the most varied of combinations.

What is claimed is:

1. A variable speed drive for driving an electric motor and providing a safe torque off (STO) function, the drive comprising two parallel signal buffers connected to a safety controller and at least one IGBT gate driver circuit, wherein the signal buffers share the same IGBT gate control signal as inputs and feed them to the same IGBT gate driver circuits and wherein each signal buffer has an own STO control signal for activation and deactivation of outputs.

2. The variable speed drive according to claim 1, wherein the safety controller comprises a complex programmable logic device (CPLD) and/or a field programmable gate array (FPGA) and/or a microcontroller unit (MCU).

3. The variable speed drive according to claim 2, wherein outputs for a certain gate of the two buffers are connected to the same point through series diodes.

4. The variable speed drive according to claim 2, wherein all gate control signals to be cut off by the STO function are connected through series diodes.

5. The variable speed drive according to claim 2, wherein each buffer has four input channels, one for each gate control signal and a fourth for being constantly supplied with a logical high input.

6. The variable speed drive according to claim 2, wherein either of the two buffers can be used to deliver signals to the IGBT gate driver circuits.

7. The variable speed drive according to claim 1, wherein outputs for a certain gate of the two buffers are connected to the same point through series diodes.

8. The variable speed drive according to claim 7, wherein all gate control signals to be cut off by the STO function are connected through series diodes.

9. The variable speed drive according to claim 7, wherein each buffer has four input channels, one for each gate control signal and a fourth for being constantly supplied with a logical high input.

10. The variable speed drive according to claim 7, wherein either of the two buffers can be used to deliver signals to the IGBT gate driver circuits.

11. The variable speed drive according to claim 1, wherein all gate control signals to be cut off by the STO function are connected through series diodes.

12. The variable speed drive according to claim 11, wherein each buffer has four input channels, one for each gate control signal and a fourth for being constantly supplied with a logical high input.

13. The variable speed drive according to claim 11, wherein either of the two buffers can be used to deliver signals to the IGBT gate driver circuits.

14. The variable speed drive according to claim 1, wherein each buffer has four input channels, one for each gate control signal and a fourth for being constantly supplied with a logical high input.

15. The variable speed drive according to claim 14, wherein the fourth input channel sets a feedback normally high during zero-vector conditions where all gate control signals can be low simultaneously.

16. The variable speed drive according to claim 1, wherein either of the two buffers can be used to deliver signals to the IGBT gate driver circuits.

17. The variable speed drive according to claim 1, wherein diagnostics of the drive is performed by activating one of the two individual low-active control signals.

18. A method for diagnosing a variable speed drive according to claim 1, comprising the steps of:
diagnosing the first buffer first,
reading back its feedback to the safety controller,
controlling the first buffer to conductive state,
diagnosing the second buffer,
reading back its feedback to the safety controller, and
controlling the second buffer to conductive state.

19. The method according to claim 18, wherein a diagnosing test pulse length is only limited by a diagnostics sequence period, wherein a test pulse length of 500 ms±200 ms, in particular ±100 ms, is used for diagnosing each buffer.

20. The variable speed drive according to claim 1, wherein an output signal from each signal buffer of the two parallel signal buffers is combined into a single signal.

* * * * *